US008452896B2

(12) United States Patent
Meskauskas

(10) Patent No.: US 8,452,896 B2
(45) Date of Patent: May 28, 2013

(54) ARRANGEMENT FOR APPLICATION MESSAGE DECOMPRESSION

(75) Inventor: Paulius Meskauskas, Espoo (FI)

(73) Assignee: Nokia Corporation, Espoo (FI)

( * ) Notice: Subject to any disclaimer, the term of this patent is extended or adjusted under 35 U.S.C. 154(b) by 2385 days.

(21) Appl. No.: 10/854,532

(22) Filed: May 26, 2004

(65) Prior Publication Data

US 2005/0004972 A1    Jan. 6, 2005

(30) Foreign Application Priority Data

Jun. 6, 2003 (WO) .................. PCT/FI03/00450

(51) Int. Cl.
*G06F 15/16* (2006.01)

(52) U.S. Cl.
USPC .......................... 709/247; 709/246

(58) Field of Classification Search
USPC .......................... 709/246, 247, 232
See application file for complete search history.

(56) References Cited

U.S. PATENT DOCUMENTS

| 2002/0057716 | A1* | 5/2002 | Svanbro et al. ............ 370/477 |
| 2003/0145115 | A1 | 7/2003 | Worger et al. |
| 2003/0169783 | A1* | 9/2003 | Coffin et al. ............... 370/536 |
| 2003/0191860 | A1* | 10/2003 | Gadepalli et al. ........... 709/247 |
| 2005/0015514 | A1* | 1/2005 | Garakani et al. ............ 709/247 |

FOREIGN PATENT DOCUMENTS

| AU | 200041173 B2 * | 4/2000 |
| CN | 1361997 | 7/2002 |
| WO | WO 03/017618 A1 | 2/2003 |

OTHER PUBLICATIONS

Price, R. et al, Request for Comments: 3320, "Signaling Compression (SigComp)", Jan. 2003.*
Symbian Ltd, Symbian Developer Library, "Subsystems and APIs in Symbian OS Guide", 2002 http://www.symbian.com/developer/techlib/v70sdocs/doc_source/devguides/SubsystemsAndAPIs.guide.html.*
Dixon, "Symbian OS Version 7.0s, Functional Description", Apr. 2003.
Price et al., "Signaling Compression (SigComp)", RFC 3320, Jan. 2003.
Wu et al., "Lightweight SIP/SDP Compression Scheme (LSSCS)", Proceedings of SPIE, vol. 4586, 2001, p. 67-76.
Office Action dated Jan. 20, 2011 from European Application No. 03730262.7, 7 pages.
Office Action dated Jan. 30, 2012 from European Application No. 03730262.7, 6 pages.
Deutsch, P.; *DEFLATE Compressed Data Format Specification version 1.3*; Network Working Group, Request for Comments: 1951; Aladdin Enterprises; Category: Informational; May 1996 (15 pages).
Schulzrinne, H., et al.; *Real Rime Streaming Protocol (RTSP)*; Network Working Group, Request for Comments: 2326; Category: Standards Track; Apr. 1998 (58 pages).
Stewart, R., et al.; *Steam Control Transmission Protocol*; Network Working Group, Request for Comments: 2960; Category: Standards Track; Oct. 2000 (135 pages).
Rosenberg, J., et al.; *SIP: Session Initiation Protocol*; Network Working Group; Request for Comments: 3261; Category: Standards Track; Obsoletes: 2543; Jun. 2002 (202 pages).

* cited by examiner

*Primary Examiner* — Brian J Gillis
(74) *Attorney, Agent, or Firm* — Harrington & Smith

(57) ABSTRACT

A transport layer stream with application messages, including application messages compressed according to a signalling compression method, is received and transferred to an application client, which transfers unidentified application messages to a decompression entity configured to identify and decompress application messages compressed according to the signalling compression method. The application messages compressed according to the signalling compression method are decompressed and transferred back to the application client.

15 Claims, 3 Drawing Sheets

ARRANGEMENT FOR APPLICATION MESSAGE DECOMPRESSION

FIELD OF THE INVENTION

The present invention relates to application message decompression, and more particularly to application messages compressed according to SigComp compression.

BACKGROUND OF THE INVENTION

Many application protocols, like SIP (Session Initiation Protocol) or RTSP (Real-Time Streaming Protocol), used for multimedia communications are text-based and engineered for links having wide bandwidth. As a result, their messages have not been optimized in terms of size. For example, typical SIP messages range from a few hundred bytes up to two thousand bytes or more. With the planned usage of these protocols in wireless handsets as part of 2.5 G and 3 G cellular networks, the large message size is problematic. With low-rate IP connectivity the transmission delays are significant. Taking into account retransmissions and the multiplicity of messages that are required in some flows, at least call setup and feature invocation are adversely affected.

To eliminate this problem, Signaling Compression (SigComp) architecture has been defined for robust, lossless compression of application messages. In terms of the OSI model, SigComp architecture can be interpreted as an enhancement to transport layer. Thus, SigComp provides the higher layer applications for both transmission and compression of the messages. Due to its usefulness in mobile communication, $3^{rd}$ Generation Partnership Project (3GPP) has recommended the use of SigComp at least for compressing SIP messages. Therefore, the future 3G mobile terminals must support SigComp.

The transmitting side of the SigComp architecture comprises the entities of a compressor dispatcher, one or more compressors and a state handler. The compressor dispatcher serves as the interface from the application. The application supplies the compressor dispatcher with an application message and a compartment identifier (i.e an identifier that is used for application-specific grouping of messages). The compressor dispatcher invokes a particular compressor, which returns a SigComp message to be forwarded to the remote endpoint. State handler stores and retrieves state information that is stored between SigComp messages in order to avoid the need to upload the data on a per-message basis.

The receiving side of the SigComp architecture comprises the entities of a decompressor dispatcher, an Universal Decompressor Virtual Machine (UDVM) and a state handler. The decompressor dispatcher serves as the interface towards the application. The decompressor dispatcher receives a SigComp message from the transport layer and invokes an instance of the UDVM, which decompresses the SigComp messages. The decompressor dispatcher then forwards the resulting decompressed message to the application, which may return a compartment identifier if it wishes to allow state to be saved for the message. During the decompression process the UDVM may invoke the state handler to access existing state or create new state.

The SigComp messages are transmitted as data packet flow on the transport layer along with other application messages, e.g. uncompressed SIP and RTSP messages. The SigComp messages are identified with own five-bit delimiters, i.e. they start with 11111 bits and end with 0xFFFF bits. Thus, the transport layer data stream is directed to the decompressor dispatcher, which must be arranged to identify the SigComp messages for decompression and to pass the non-SigComp messages to a particular application client, like SIP stack or RTSP.

One of the disadvantages associated with the above arrangement is that the decompressor dispatcher must be aware of all application clients and the delimiters they use. Thus, every time when a new client is introduced, the decompressor dispatcher logic must be updated. A further major problem is involved with the binary content of the application messages. The delimiters of SigComp messages may appear also in application messages, e.g. 11111 bit pattern may be found in a SIP message. This may lead to misinterpretations of delimiters in the decompressor dispatcher and result in malfunction of the dispatcher.

BRIEF DESCRIPTION OF THE INVENTION

An object of the present invention is thus to provide a simplified method and an apparatus for implementing the method so as to overcome the above problems while simultaneously remaining compatible with the SigComp architecture. The objects of the invention are achieved by a system, methods, terminal and software products, which are characterized by what is stated in the independent claims. The preferred embodiments of the invention are disclosed in the dependent claims.

A first aspect of the invention is based on the idea of decompressing application messages, wherein a transport layer data packet stream including application messages, at least one of the application messages being compressed according to a signalling compression method, such as SigComp compression, is received. The received transport layer data packet stream is transferred to at least one application client, wherein the uncompressed application messages directed to said application client are identified. The unidentified application messages are transferred to a decompression entity configured to identify and decompress application messages compressed according to said signalling compression method, such as SigComp compression. If application messages compressed according to said signalling compression method, such as SigComp compression, are found, they are decompressed and transferred back to said application client.

According to a preferred embodiment of the first aspect of the invention, the uncompressed application messages and the application messages compressed according to SigComp compression are identified by their message delimiters.

According to a further preferred embodiment of the first aspect of the invention, a protocol layer interface is provided from said decompression entity only towards said at least one application client.

According to a further preferred embodiment of the first aspect of the invention, in said at least one application client, each of the decompressed application messages is linked to a compartment class instance.

According to a further preferred embodiment of the first aspect of the invention, said decompression entity is implemented in Symbian OS, whereby at least the following interfaces are provided from said decompression entity to Symbian OS: API to security management functionalities of Symbian OS; API to application framework of Symbian OS and API to Symbian OS Base.

A second aspect of the invention is based on the idea of compressing application messages, wherein from at least one application client at least one application message is transferred to a compression entity configured to compress application messages according to a signalling compression method, such as SigComp compression. The application message is compressed according to said signalling compression method, such as SigComp compression, and transferred back to said application client. The at least one compressed application message is then transferred to a transport layer to form a transport layer data packet stream, which thus includes at least one application message compressed according to said signalling compression method, such as SigComp compression.

According to a preferred embodiment of the second aspect of the invention, said compression entity is provided for a plug-in capability for introducing new compressors.

According to a further preferred embodiment of the second aspect of the invention, in said at least one application client, a compartment class is created for identifying the compressed application messages for the communication with a particular endpoint and a compartment class instance is allocated for each compressed application message.

An advantage of the methods and the arrangement of the invention is that the dispatchers are no longer needed. Thus, the implementation is simplified and the problem of the dispatcher logic updating is bypassed. A further advantage of the invention is that, since the responsibility of monitoring the transport layer stream is shifted to the application clients, the binary content of the application message delimiters does not cause any confusion in interpretation. A further advantage of the invention is that, since the dispatchers are not used, neither are compartment identifiers. Thus, the implementation is even more simplified. A further advantage of the invention is that due to the plug-in architecture for compressor, new compressors can be fluently introduced to the compression entity without affecting the operation of the application clients.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

The invention will now be discussed by referring to the SigComp architecture as an example of the signalling compression method, in conjunction of which the invention can be implemented. The invention is, however, not restricted to the SigComp architecture, but it can be implemented in signalling compression architecture, which includes the similar elements disclosed in the enclosed claims.

Figure 1:
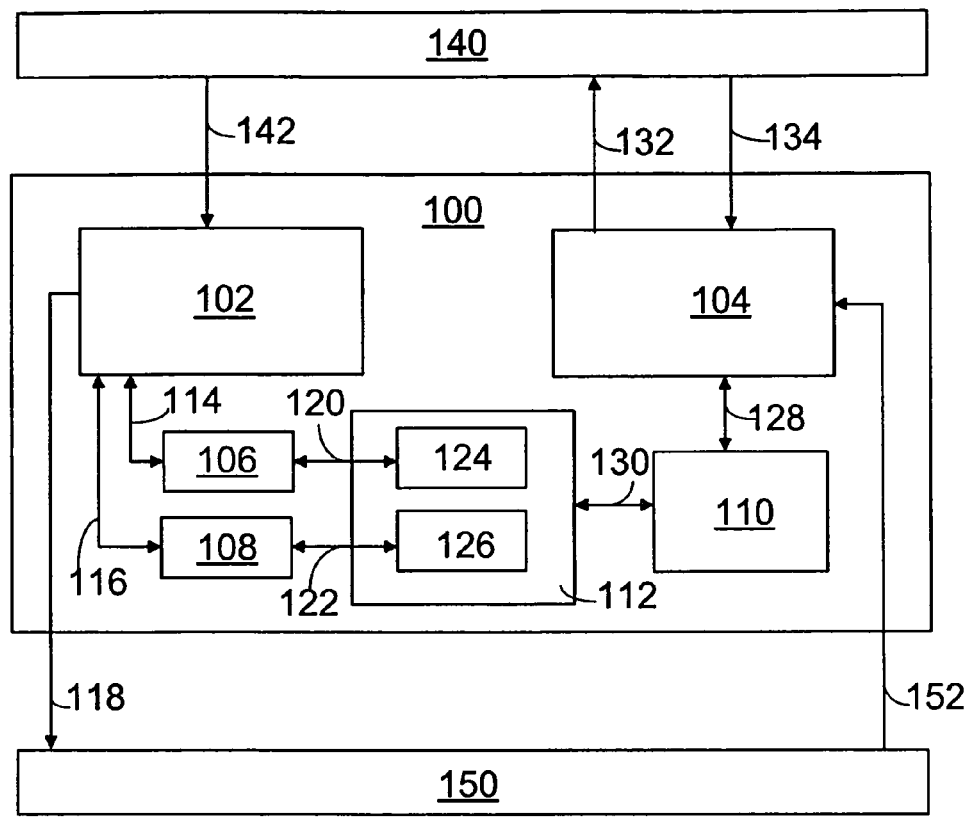
FIG. 1 shows the general functional elements of the Sig-Comp architecture.

Referring now to FIG. 1, the SigComp architecture will be further illustrated for its relevant elements. For a more detailed description of the SigComp architecture, a reference is made to IETF document *RFC* 3320, *"Signaling Compression (SigComp)"*, January 2003.

FIG. 1 shows the functional elements of the SigComp architecture (100) placed between the application layer (140) and the transport layer (150) of the OSI model. The applications supported by SigComp comprise several application protocols, including SIP (Session Initiation Protocol, disclosed in *RFC* 3261) and RTSP (Real-Time Streaming Protocol, disclosed in RFC 2326). The transport protocols supported by SigComp, in turn, comprise several transports, including TCP, UDP and SCTP (Stream Control Transmission Protocol, disclosed in *RFC* 2960). The SigComp architecture uses the transport layer for transferring the SigComp messages and the SigComp architecture can thus be seen as an enhancement of the transport layer for the applications. It is noted that the implementation of the invention disclosed further below is not restricted by the application protocols or the transport protocols used.

The SigComp architecture is designed for bi-directional message transfer. Therefore, the endpoints of the message transfer (e.g. user equipments UE of a mobile network) typically comprise all necessary elements for both compression and decompression of the SigComp messages. FIG. 1 shows an overview of such SigComp endpoint. The SigComp layer (100) is decomposed into the compressor and decompressor dispatchers (102, 104), one or more compressors (106, 108), the Universal Decompressor Virtual Machine UDVM (110, i.e. the decompressor functionality) and the state handler (112).

The compressor dispatcher (102) serves as the interface from the application (140). The application supplies the compressor dispatcher with an application message and a compartment identifier (142). A compartment is a group of messages that relate to a certain peer endpoint, whereby the grouping is performed by the application. Depending on the signaling protocol, this grouping may relate to application concepts such as "session", "dialog", "connection", or "association". The application allocates state memory on a per-compartment basis, and determines when a compartment should be created or, closed. The compartment identifier identifies the compartment uniquely. The compressor dispatcher comprises a routing table, wherein the compartment identifiers and the compressors are linked together.

The compressor dispatcher (102) invokes a particular compressor (106, 108), which performs the actual conversion of the application messages into SigComp messages. Distinct compressors are invoked on a per-compartment basis, using the compartment identifiers supplied by the application. A compressor receives an application message (114, 116) from the compressor dispatcher, compresses the message, and returns a SigComp message (114, 116) to the compressor dispatcher. Each compressor chooses a certain algorithm to encode the data. The selected compressor returns a SigComp message to be forwarded (118) to the remote endpoint via the transport layer (150). State handler (112) can store and retrieve (120, 122) state information (124, 126), i.e. information that is stored between SigComp messages, thus avoiding the need to upload the data on a per-message basis. For security purposes it is only possible to create new state with the permission of the application The decompressor dispatcher (104), in turn, forms the interface from the transport layer (150) towards the application (140). The decompressor dispatcher receives a SigComp message (152) from the transport layer and invokes an instance (128) of the UDVM (110), which provides the decompression functionality for SigComp. The UDVM is a virtual machine designed solely for the purpose of running decompression algorithms. The UDVM can be configured to understand the output of many well-known compressors, such as Deflate (disclosed in *RFC* 1951). During the decompression process the UDVM may invoke (130) the state handler to access existing state or create new state. The decompressed application message is returned to the decompressor dispatcher to be forwarded (132) to the application, which may return a compartment identifier (134) if it wishes to allow state to be saved for the message.

When compressing a bidirectional application protocol, the choice to use SigComp can be made independently in both directions, and compression in one direction does not necessarily imply compression in the reverse direction. Moreover, even when two communicating endpoints send SigComp messages in both directions, there is no need to use the same compression algorithm in each direction.

From an application perspective the SigComp layer appears as a new transport, with similar behavior to the original transport used to carry uncompressed data (e.g. SigComp/UDP behaves similarly to native UDP). The uncompressed application messages and SigComp messages are typically multiplexed on the same port, even though applications can reserve a new port specifically for SigComp messages.

If a particular endpoint wishes to be stateful then it needs to partition its decompressed messages into compartments under which state can be saved. SigComp relies on the application to provide this partition. So for stateful endpoints a new interface is required to the application in order to leverage the authentication mechanisms used by the application itself. When the application receives a decompressed message, it maps the message to a certain compartment and supplies the compartment identifier to SigComp. Each compartment is allocated a separate compressor and a certain amount of memory to store state information, so the application must assign distinct compartments to distinct remote endpoints.

Thus, the SigComp architecture sets several requirements of operation and implementation for both the applications and the SigComp dispatchers. While aiming to ensure the robustness of SigComp operation, these requirements, at the same time, impede the introduction of new applications and expect the dispatchers to be updated to correspond to the applications. Furthermore, the decompressor dispatcher is subject to misinterpretation of SigComp delimiters and bit patterns of uncompressed application messages multiplexed on the same data packet stream. These disadvantages are further emphasized in open platform environment, like in Symbian OS designed for mobile terminals, wherein new applications may be easily developed and introduced.

According to a preferred embodiment, these problems may be solved by a simplified SigComp architecture, wherein the primary responsibility for reading the transport layer data packet stream is allocated to the applications, and only if the application cannot recognize the content of the stream, the data packets are fed into the simplified SigComp implementation called SigComp subsystem SCSS.

Figure 2:
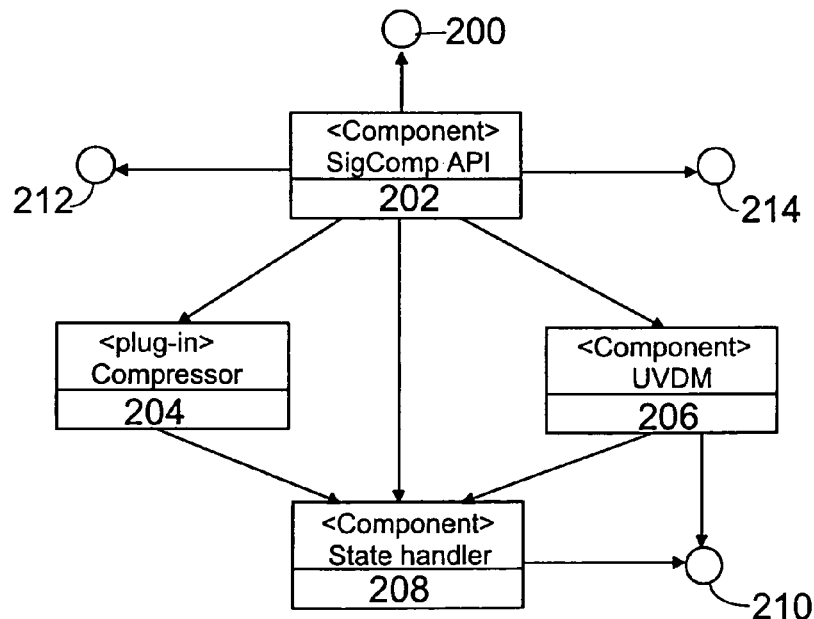
FIG. 2 shows a preferred embodiment of the simplified structure of the SigComp architecture.

FIG. 2 illustrates the structure of the SigComp subsystem SCSS. The SCSS is implemented to perform tasks compatible to SigComp architecture according to RFC 3320, but the SCSS omits the usage of the dispatchers. As a result, the SCSS does not contain a direct interface towards the transport layer, but only towards the application layer. Therefore, the SCSS can be seen as subordinated to the application clients.

For the communication with the clients (200), the SCSS comprises SigComp API (Application Programming Interface) Implementation (202), which is responsible for receiving application messages to be SigComp-compressed from the clients and for feeding the SigComp-compressed application messages to the clients, which deliver them to the transport layer for transmission. The compression takes place in a SigComp-compressor (204), like Deflate compressor, which is advantageously introduced in the SCSS as a plug-in. Due to the plug-in architecture for the compressors, new compressors can be dynamically added to the SCSS.

For decompression purposes, the SCSS comprises the UVDM (206). Thereby, the SigComp API Implementation is responsible for receiving the SigComp-compressed application messages from the clients (which have captured the messages from the transport layer stream) and for feeding the application messages decompressed by the UDVM back to the clients. The plug-in architecture for the compressors does not set any further requirements for the UVDM, since whatever compressor is used, the compressed data is always combined with a set of UVDM instructions, which allow the original data to be extracted by the UVDM.

Furthermore, in order to be fully SigComp compliant, the SCSS comprises the state handler (208) as a further component. For security reasons, the state of the client should not be revealed outside the peers. Therefore, the state identifier should always be encrypted with an encryption algorithm. Also the SCSS comprises an interface (210, Crypto API) for the cryptography algorithms to be accessed by both the state handler and the UVDM.

If implemented in Symbian OS, said Crypto API interface (210) provides access to the security management functionalities of Symbian OS, wherein several encryption and hash algorithms are provided. For the Symbian OS implementation, some additional interfaces may be included in the SCSS: Plug-in Framework API (212) from the application framework of Symbian OS, whereby new compressor implementations can be introduced to the SCSS preferably as a plug-in, and File Server API (214) from Symbian OS Base, which provides the kernel, file server, device drivers, etc., which are required for the handling of application files.

Figure 3:
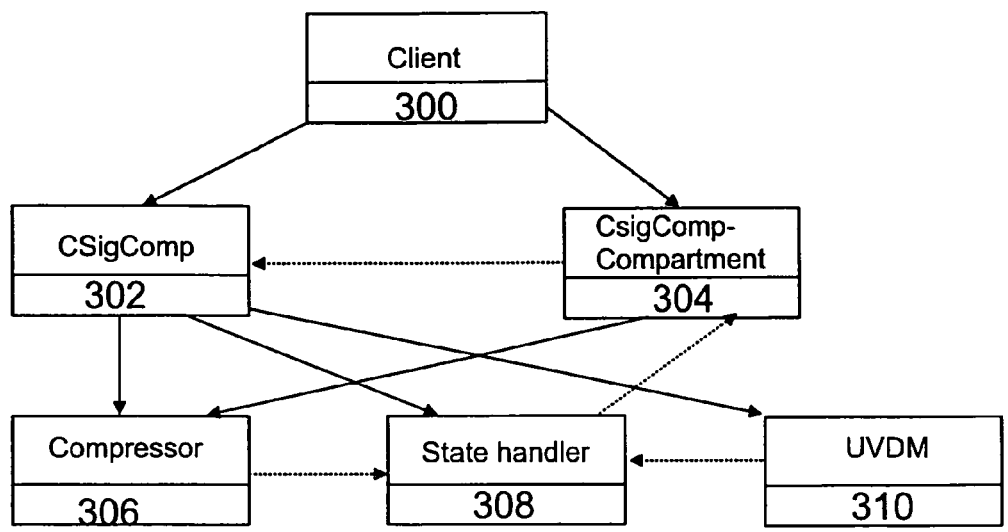
FIG. 3 shows a preferred embodiment of the application message identification and status information arrangment.

As stated above, the dispatchers are not used in the SCSS configuration. Thus, neither compartment identifiers are used. The client only creates a separate compartment class instance for the communication for a particular endpoint. This is illustrated in FIG. 3, wherein the client (300) creates only one instance of CSigComp class (302) and as many instances of CSigCompCompartment class (304) as is needed. For the creation of a SigComp message, CSigCompCompartment class instance is aware of the compressor (306) that should be used for compression. The compressor, in turn, is aware of the state handler (308), which supplies the states of the compartment, which requested the compression service for the creation of a stateful endpoint of communication. When the client creates the CSigComp class instance, it defines the compression algorithm to be used, which causes the loading of a particular plug-in compressor. The client further defines the SigComp parameters, such as memory size, cycles per bit, decompression memory size, to be used and optionally the static dictionary.

For decompression, the client forwards the received SigComp message to the CSigComp class instance and requests for decompression. The CSigComp class-instance invokes an instance of the UDVM (310), which decompresses the message according to the UVDM instructions comprised by the message. The decompressed message is returned to the CSigComp class instance, which allows the client to save or deny the state. Then the decompressed message is returned to the respective application.

Thus, the usage of the dispatchers, and compartment identifiers as well, can advantageously be avoided. The routing table comprised by compressor dispatcher, in which the compartment identifiers and the compressors are linked together, is preferably not needed.

Figure 4:
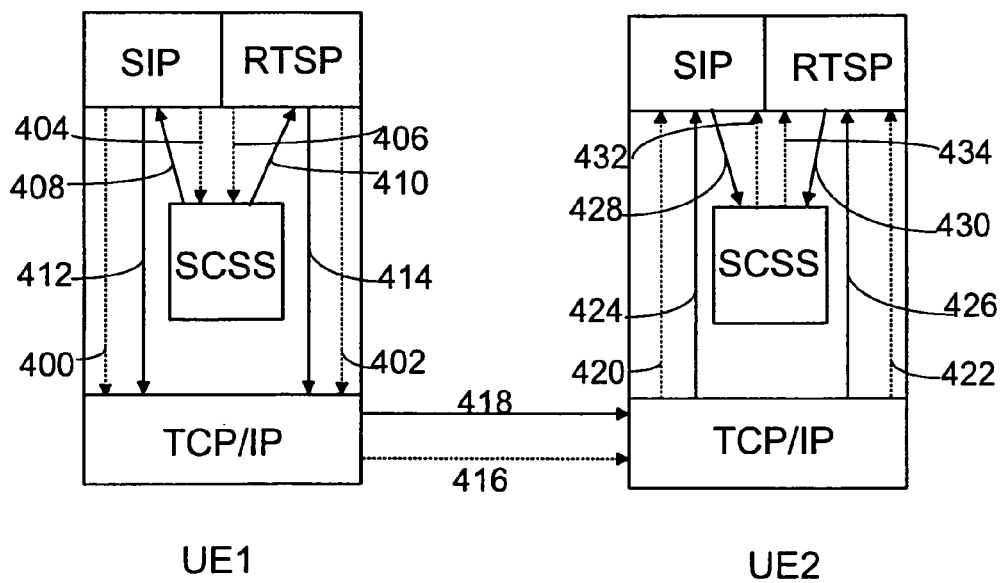
FIG. 4 shows a preferred embodiment of the application message flow on protocol layers.

The benefits of the SCSS are further illustrated with a reference to FIG. 4, wherein the operation of the SCSS is linked between the application and transport protocol layers of the OSI model. For clarity reasons, FIG. 4 shows only a unidirectional application message flow from the first endpoint (e.g. user equipment UE1 of a mobile network) to the second endpoint (e.g. user equipment UE2 of a mobile network). It is clear that such endpoints, like mobile terminals, are typically capable of using bi-directional SigComp message transmission. It is also clear that using SigComp compression in one direction does not necessarily imply compression in the reverse direction. On the application layer, only two application protocols, SIP and RTSP, are shown as the examples. Likewise, on the transport layer only TCP is used to exemplify the implementation. Naturally, the implementation is not limited to these protocols.

The implementation is based on the principle that the applications, not the SCSS, are responsible for using the transport layer. Thus, both SIP and RTSP may deliver their uncompressed application messages (400, 402, dash line arrows) with application-specific message delimiters directly to TCP for transmission. However, if the application messages require compression, as is often advantageous in wireless communication, the SigComp compression can be used. Then both SIP and RTSP deliver their uncompressed application messages (404, 406) to the SCSS for compression. The SCSS returns the SigComp messages (408, 410, solid line arrows) with SigComp delimiters to the clients, which forward them to TCP for transmission from the first terminal UE1 (412, 414).

On the TCP layer, the uncompressed (416) and the SigComp compressed (418) messages are typically multiplexed on the same TCP stream for transmission. The second terminal UE2 receives the TCP stream and forwards both the uncompressed (420, 422) and the SigComp compressed (424, 426) messages to the application layer. The application clients, like SIP and RTSP, know their own application-specific message delimiters and can identify messages that belong to them. For instance, the SIP client can identify the start and the end of a SIP message, and determine the length of the message, whereby the possibly confusing binary content in the SIP message does not cause any misinterpretations.

If the application client cannot construe the content of the stream, the data packet stream (428, 430) is forwarded and buffered to the SCSS. The SCSS seeks to identify any SigComp messages with SigComp delimiters, and if found, it tries to decompress the messages. The decompressed application messages (432, 434) are returned to the particular application client. If the SCSS cannot decompress the message, then most probably the content of the stream is either corrupted or wrong, i.e. not a SigComp message. As a response, the SCSS delivers an error message to the client.

It is important to notice that the operation of the decompression functionality described above does not require that the SigComp messages included in the stream should be compressed with the SCSS, but the SCSS is fully compatible for the decompression of all SigComp messages, provided they are compressed properly with a set of UVDM instructions.

Thus, a flexible and easily updated configuration for the SigComp implementation is provided. The SCSS provides the application clients for just the necessary elements, which are needed to utilize the SigComp compression messages. The core SCSS configuration described herewith requires no updates even though the surrounding configuration, like the application clients, may be changed. For instance, if a new application client is introduced later on, no changes in the SCSS are advantageously needed, since the application clients are configured to know their own application-specific message delimiters and are thus capable of reading the TCP stream. On the other hand, new compressors can easily be added to the core SCSS due to the plug-in architecture.

The implementation of the SCSS is not restricted by the applications or the software operating system, wherein the SCSS could be implemented. As referred above, the SCSS is, however, especially useful in various open platform systems, like Symbian OS, which is an open operating system designed for mobile phone usage. Additional application message compression is often needed in wireless communication, and Symbian OS offers a flexible framework for application development, whereby new applications requiring application message compression will be introduced in the future.

Figure 5:
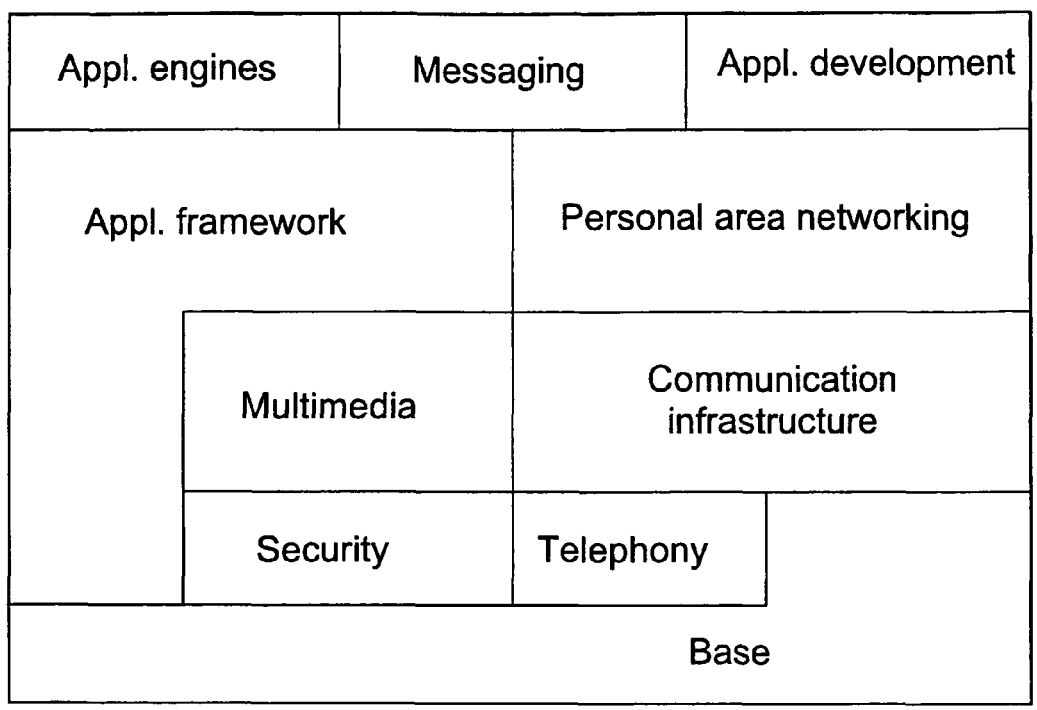
FIG. 5 shows a general structure of Symbian OS.

Symbian OS is the operating system designed for the specific requirements of open, data-enabled 2G, 2.5 G and 3 G mobile phones. Symbian OS provides a core set of application programming interfaces (APIs) and technologies that is shared by all Symbian OS phones. The key features of Symbian OS v 7.0 are shown in FIG. 5. Symbian OS Base includes programming framework, i.e. kernel, user library, file server, etc., for all other components of Symbian OS. Various telephony (e.g. GSM, W-CDMA) and other communication services (e.g. TCP, IP, HTTP) are supported by Symbian OS. Separate APIs are available for multimedia and security functionalities. Application framework provides an access for user interface applications. Personal area framework includes client stacks for Bluetooth, IR and USB applications.

Symbian OS provides various application engines for contacts, schedule, messaging, browsing, etc. and integrated APIs for data management, text, clipboard and graphics. Messaging functionalities include multimedia messaging (MMS), enhanced messaging (EMS) and SMS, e-mail, file attachments and fax. Application development tools for Symbian OS include at least C++ and Java. For a more detailed description of Symbian OS, a reference is made to "*Symbian OS Version 7.0s, Functional description*", Rev. 2.0, April 2003, (www.symbian.com).

It should be noted that the functional elements of the SCSS according to the invention can advantageously be implemented as software, hardware or a combination thereof. The SCSS is particularly well suited for computer software implementation, which comprises computer-readable commands for controlling a processor of a user terminal, for instance, and for executing the functional steps of the invention. Advantageously the SCSS can be implemented as a program code stored on a storage medium and executed with a computer-like device, such as a personal computer (PC) or a mobile station, for providing the necessary SigComp functions with said device. Further, the SCSS functions of the invention can be loaded on the computer as a software update, whereby the functions according to the invention can be produced in the already known devices.

For the implementation of the various embodiments in a Symbian OS compatible user equipment (mobile terminal), the means for implementing the invention are preferably comprise software code for receiving transport layer data packet stream including application messages, at least one of the application messages being compressed according to SigComp compression, software code for transferring the received transport layer data packet stream to at least one application client, software code for identifying the uncompressed application messages directed to said at least one application client, software code for transferring unidentified application messages to a decompression entity configured to identify and decompress application messages compressed according to SigComp compression, software code for decompressing said at least one application message compressed according to SigComp compression, and software code for transferring the decompressed application messages back to said at least one application client.

Furthermore, said means may preferably comprise software code for transferring from at least one application client at least one application message to a compression entity configured to compress application messages according to SigComp compression, software code for compressing said at least one application message according to SigComp compression, software code for transferring the at least one compressed application message back to said at least one application client, and software code for transferring the at least one compressed application message to a transport layer to form a transport layer data packet stream including at least one application message compressed according to SigComp compression.

It will be obvious to a person skilled in the art that, as the technology advances, the inventive concept can be implemented in various ways. The invention and its embodiments are not limited to the examples described above but may vary within the scope of the claims.

The invention claimed is:

1. A method of decompressing application messages, comprising
receiving transport layer data packet stream including application messages, at least one of the application messages being compressed according to a signalling compression method;
transferring the received transport layer data packet stream to at least one application client;
identifying uncompressed application messages directed to said at least one application client;
transferring unidentified application messages to a decompression entity configured to identify and decompress application messages compressed according to said signalling compression method;
decompressing said at least one application message compressed according to said signalling compression method; and
transferring the decompressed application messages back to said at least one application client.

2. A method as claimed in claim 1, wherein
said signalling compression method is SigComp compression.

3. A method as claimed in claim 1, further comprising
identifying the uncompressed application messages and the application messages compressed according to said signalling compression method by message delimiters.

4. A method as claimed in claim 1, further comprising
providing a protocol layer interface from said decompression entity only towards said at least one application client.

5. A method as claimed in claim 1, further comprising
linking, in said at least one application client, each of the decompressed application messages to a compartment class instance.

6. A method as claimed in claim 1, further comprising
implementing said decompression entity in Symbian OS, whereby
providing at least the following interfaces from said decompression entity to Symbian OS:
API to security management functionalities of Symbian OS
API to application framework of Symbian OS
API to Symbian OS Base.

7. A method of compressing application messages, comprising
transferring from at least one application client at least one application message to a compression entity between an application layer and a transport layer, said compression entity being configured to compress application messages according to a signalling compression method;
compressing said at least one application message according to said signalling compression method;
transferring the at least one compressed application message back to said at least one application client; and
transferring the at least one compressed application message to a transport layer to form a transport layer data packet stream including at least one application message compressed according to said signalling compression method.

8. A method as claimed in claim 7, further comprising
providing said compression entity for a plug-in capability for introducing new compressors.

9. A method as claimed in claim 7, further comprising
creating, in said at least one application client, a compartment class for identifying the compressed application messages for the communication with a particular endpoint; and
allocating a compartment class instance for each compressed application message.

10. A method as claimed in claim 7, wherein
said signalling compression method is SigComp compression.

11. A telecommunication system, comprising a first endpoint for compressing application messages to be transmitted on a transport layer, and a second endpoint for decompressing application messages received from the transport layer, wherein
said first endpoint is configured to transfer from at least one application client at least one application message to a compression entity configured to compress application messages according to a signalling compression method; compress said at least one application message according to said signalling compression method; transfer the at least one compressed application message back to said at least one application client; and transfer the at least one compressed application message to a transport layer to form a transport layer data packet stream including at least one application message compressed according to said signalling compression method;
said second endpoint is configured to receive transport layer data packet stream including application messages, at least one of the application messages being compressed according to said signalling compression method; transfer the received transport layer data packet stream to at least one application client; identify uncompressed application messages directed to said at least one application client; transfer unidentified application messages to a decompression entity configured to identify and decompress application messages compressed according to said signalling compression method; decompress said at least one application message compressed according to said signalling compression method; and transfer the decompressed application messages back to said at least one application client.

12. A terminal comprising:
a memory configured to store computer-executable instructions; and
a processor configured to execute the stored instructions by performing steps including receiving transport layer data packet stream including application messages, at least one of the application messages being compressed according to a signalling compression method;
transferring the received transport layer data packet stream to at least one application client;
identifying uncompressed application messages directed to said at least one application client;
transferring unidentified application messages to a decompression entity configured to identify and decompress application messages compressed according to said signalling compression method;
decompressing said at least one application message compressed according to said signalling compression method; and
transferring the decompressed application messages back to said at least one application client.

13. A terminal comprising:
a memory configured to store computer-executable instructions; and
a processor configured to execute the stored instructions by performing steps including
transferring from at least one application client at least one application message to a compression entity between an application layer and a transport layer, said compression entity being configured to compress application messages according to a signalling compression method;
compressing said at least one application message according to a signalling compression method;
transferring the at least one compressed application message back to said at least one application client; and
transferring the at least one compressed application message to a transport layer to form a transport layer data packet stream including at least one application message compressed according to a signalling compression method.

14. A non-transitory computer readable medium encoded with software for decompressing application messages, comprising
software code for receiving transport layer data packet stream including application messages, at least one of the application messages being compressed according to a signalling compression method;
software code for transferring the received transport layer data packet stream to at least one application client;
software code for identifying uncompressed application messages directed to said at least one application client;
software code for transferring unidentified application messages to a decompression entity configured to identify and decompress application messages compressed according to said signalling compression method;
software code for decompressing said at least one application message compressed according to said signalling compression method; and
software code for transferring the decompressed application messages back to said at least one application client.

15. A non-transitory computer readable medium encoded with software for compressing application messages, comprising
software code for transferring from at least one application client at least one application message to a compression entity configured to compress application messages according to a signalling compression method;
software code for compressing said at least one application message according to said signalling compression method;
software code for transferring the at least one compressed application message back to said at least one application client; and
software code for transferring the at least one compressed application message to a transport layer to form a transport layer data packet stream including at least one application message compressed according to said signalling compression method.

* * * * *